United States Patent
Hung et al.

(10) Patent No.: US 10,957,375 B2
(45) Date of Patent: Mar. 23, 2021

(54) DYNAMIC RANDOM ACCESS MEMORY (DRAM) CELL, DRAM DEVICE AND STORAGE METHOD

(71) Applicant: Changxin Memory Technologies, Inc., Anhui (CN)

(72) Inventors: Kei Kang Hung, Hefei (CN); Qi-An Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 16/883,635

(22) Filed: May 26, 2020

(65) Prior Publication Data

US 2020/0286540 A1    Sep. 10, 2020

Related U.S. Application Data

(63) Continuation of application No. PCT/CN2018/119917, filed on Dec. 7, 2018.

(30) Foreign Application Priority Data

Dec. 7, 2017    (CN) .................. 201711287306.X

(51) Int. Cl.
*G11C 11/36*    (2006.01)
*G11C 11/408*    (2006.01)
*G11C 11/4091*    (2006.01)

(52) U.S. Cl.
CPC .......... *G11C 11/36* (2013.01); *G11C 11/4087* (2013.01); *G11C 11/4091* (2013.01)

(58) Field of Classification Search
CPC . G11C 11/36; G11C 11/4087; G11C 11/4091; G11C 11/404; G11C 11/41; G11C 11/401; G11C 11/4063
See application file for complete search history.

(56) References Cited

U.S. PATENT DOCUMENTS 6,005,801 A    12/1999    Wu et al.
6,944,051 B1    9/2005    Lee et al.
(Continued)

FOREIGN PATENT DOCUMENTS

CN    108053854 A    5/2018
JP    H06326272 A    11/1994

OTHER PUBLICATIONS

PCT International Search Report and the Written Opinion dated Feb. 27, 2019, issued in related International Application No. PCT/CN2018/119917 (7 pages).

*Primary Examiner* — Mohammed A Bashar
(74) *Attorney, Agent, or Firm* — Sheppard Mullin Richter & Hampton LLP

(57) ABSTRACT

A DRAM cell includes a transistor, a first diode and a second diode. The transistor has a gate electrically coupled to a word line of an address decoder and a drain electrically coupled to a bit line of the address decoder. The bit line is coupled to a power supply voltage. An anode and a cathode of the first diode are coupled to a cathode and an anode of the second diode, respectively. Each of the first diode and the second diode is coupled at a first end to a source of the transistor at a first node, and at a second end to a node voltage at the second node. A DRAM device includes an address decoder and DRAM cells. A storage method for a DRAM device includes writing data into the DRAM cells and reading data from the DRAM cells.

20 Claims, 2 Drawing Sheets

(56) References Cited

U.S. PATENT DOCUMENTS

| | | | |
|---|---|---|---|
| 7,277,313 B2* | 10/2007 | Campbell | G11C 13/0011 365/105 |
| 2007/0195626 A1 | 8/2007 | Kim et al. | |
| 2011/0007546 A1* | 1/2011 | Amin | H01L 27/1021 365/148 |
| 2014/0286085 A1* | 9/2014 | Miyakawa | G11C 5/147 365/158 |
| 2015/0263181 A1* | 9/2015 | Berger | G11C 11/40603 257/104 |

* cited by examiner

# DYNAMIC RANDOM ACCESS MEMORY (DRAM) CELL, DRAM DEVICE AND STORAGE METHOD

CROSS-REFERENCE TO RELATED APPLICATIONS

This application is a continuation application of International Patent Application No.: PCT/CN2018/119917, filed on Dec. 7, 2018, which claims priority to China Patent Application No. 201711287306.X, filed with the China Patent Office on Dec. 7, 2017 and entitled "DYNAMIC RANDOM ACCESS MEMORY (DRAM) CELL, DRAM DEVICE AND STORAGE METHOD." The above-referenced applications are incorporated herein by reference in their entirety.

TECHNICAL FIELD

The present disclosure relates to semiconductor technology and, in particular, to a dynamic random-access memory (DRAM) cell, a DRAM device and a storage method.

BACKGROUND

Dynamic random-access memory (DRAM) devices are constructed based on memory cells each including a transistor and a capacitor. The capacitor can be charged when a voltage is applied on the transistor, and one bit of data can be stored in the capacitor. However, when the transistor is turned off, the electrical charge in the capacitor may leak over time and the capacitor may discharge. Therefore, the datum stored in the capacitor needs to be refreshed or restored at a predetermined time interval. Each refresh, however, leads to energy consumption of the system.

Moreover, despite the rapidly increased demand of storage bandwidths in electronics devices, time delays from clock delayers and clock processors to data transmission components in the DRAMs remain unchanged, making the storage speed of current DRAM devices increasingly lag behind demand.

SUMMARY OF THE DISCLOSURE

The present disclosure solves at least the above problems by providing a DRAM cell, a DRAM device and a storage method.

The DRAM cell of the present disclosure comprises:
a transistor having a gate electrically coupled to a word line of an address decoder and a drain electrically coupled to a bit line of the address decoder, wherein the bit line is coupled to a power supply voltage;
a first diode; and
a second diode, wherein an anode of the second diode is coupled to a cathode of the first diode at a first node, and a cathode of the second diode is coupled to an anode of the first diode at a second node, the first node is coupled to a source of the transistor, the second node is coupled to a node voltage,
wherein an absolute value of a difference between the node voltage and the power supply voltage is smaller than a cut-in voltage of the first diode and the second diode.

In some embodiments, the DRAM cell may further comprise:
a current sense amplifier having a first end coupled to the bit line and a second end coupled to the first node, wherein the current sense amplifier is configured to sense a current between the bit line and the first node, and to amplify and read the current.

In some embodiments, the node voltage may be equal to a half of the power supply voltage.

In some embodiments, each of the first diode and the second diode may comprise a charge-storage diode.

The DRAM device of the present disclosure comprises:
an address decoder, comprising a plurality of word lines and a plurality of bit lines intersecting each other to define a matrix, each of the bit lines configured to write and read data; and
a plurality of DRAM cells distributed in the matrix, each of the DRAM cells coupled to at least one of the bit lines and at least one of the word lines,
wherein the each of the DRAM cells comprises:
a transistor having a gate electrically coupled to a word line of an address decoder and a drain electrically coupled to a bit line of the address decoder, wherein the bit line is coupled to a power supply voltage;
a first diode; and
a second diode, wherein an anode of the second diode is coupled to a cathode of the first diode at a first node, and a cathode of the second diode is coupled to an anode of the first diode at a second node, the first node is coupled to a source of the transistor, the second node is coupled to a node voltage,
wherein an absolute value of a difference between the node voltage and the power supply voltage is smaller than a cut-in voltage of the first diode and the second diode.

The present disclosure provides a storage method for a DRAM device. The method comprises:
providing a DRAM device comprising an address decoder and a plurality of DRAM cells, the address decoder comprising a plurality of word lines and a plurality of bit lines intersecting each other to define a matrix, each of the bit lines configured to write and read data, the DRAM cells distributed in the matrix, each of the DRAM cells coupled to at least one of the bit lines and at least one of the word lines; and
storing data on the first diode and the second diode,
wherein the each of the DRAM cells comprises:
a transistor having a gate electrically coupled to a word line of an address decoder and a drain electrically coupled to a bit line of the address decoder, wherein the bit line is coupled to a power supply voltage;
a first diode; and
a second diode, wherein an anode of the second diode is coupled to a cathode of the first diode at a first node, and a cathode of the second diode is coupled to an anode of the first diode at a second node, the first node is coupled to a source of the transistor, the second node is coupled to a node voltage,
wherein an absolute value of a difference between the node voltage and the power supply voltage is smaller than a cut-in voltage of the first diode and the second diode.

In some embodiments, the storage method may further comprise: applying a turn-on voltage to the word line to turn on a transistor and then applying a power supply voltage to the bit line so as to write a datum.

In some embodiments, the storage method may further comprise: applying the node voltage to the second node, wherein the node voltage is lower than the power supply voltage; and after the power supply voltage is introduced into the first diode and the second diode via the transistor and stored therein, removing the turn-on voltage to turn off the transistor.

In some embodiments, the turn-on voltage is the sum of the power supply voltage and a threshold voltage of the transistor.

In some embodiments, the storage method may further comprise: applying the power supply voltage to the bit line and then applying the turn-on voltage to the word line to turn on the transistor so as to read a datum.

In some embodiments, the storage method may further comprise: sensing an absence or a presence of a current between the bit line and the first node; and reading the datum stored in the first diode and the second diode based on the absence or presence of the current.

In some embodiments, a datum of "1" represents the presence of the current between the bit line and the first node. In some embodiments, a datum of "0" represents the absence of the current between the bit line and the first node.

In some embodiments, the power supply voltage includes a high voltage level and a low voltage level.

In some embodiments, the node voltage applied on a second node may be equal to a half of the power supply voltage.

The present disclosure offers the following advantages.

In this disclosure, pairs of serially connected diodes are used in DRAM cells to store data in lieu of capacitors, dispensing with the need of regular refresh for maintaining the stored data and thus reducing power consumption of the DRAM cells. In addition, the diodes can store electrical charge at a higher speed than that of the capacitors, thereby improving data transmission capability of DRAM devices.

The preceding summary is for the purpose of illustration only and is not intended to limit the scope of the present disclosure. Additional aspects, embodiments and features of the present disclosure will become readily apparent from the following detailed description, which is to be read in connection with the accompanying drawings.

BRIEF DESCRIPTION OF THE DRAWINGS

In the following accompanying drawings which are not necessarily drawn to scale, the same reference numerals indicate the same, similar or analogous components or elements, unless otherwise defined. In addition, these drawings depict only embodiments of the present disclosure and should not be considered as limiting the scope of the present disclosure.

Figure 1:
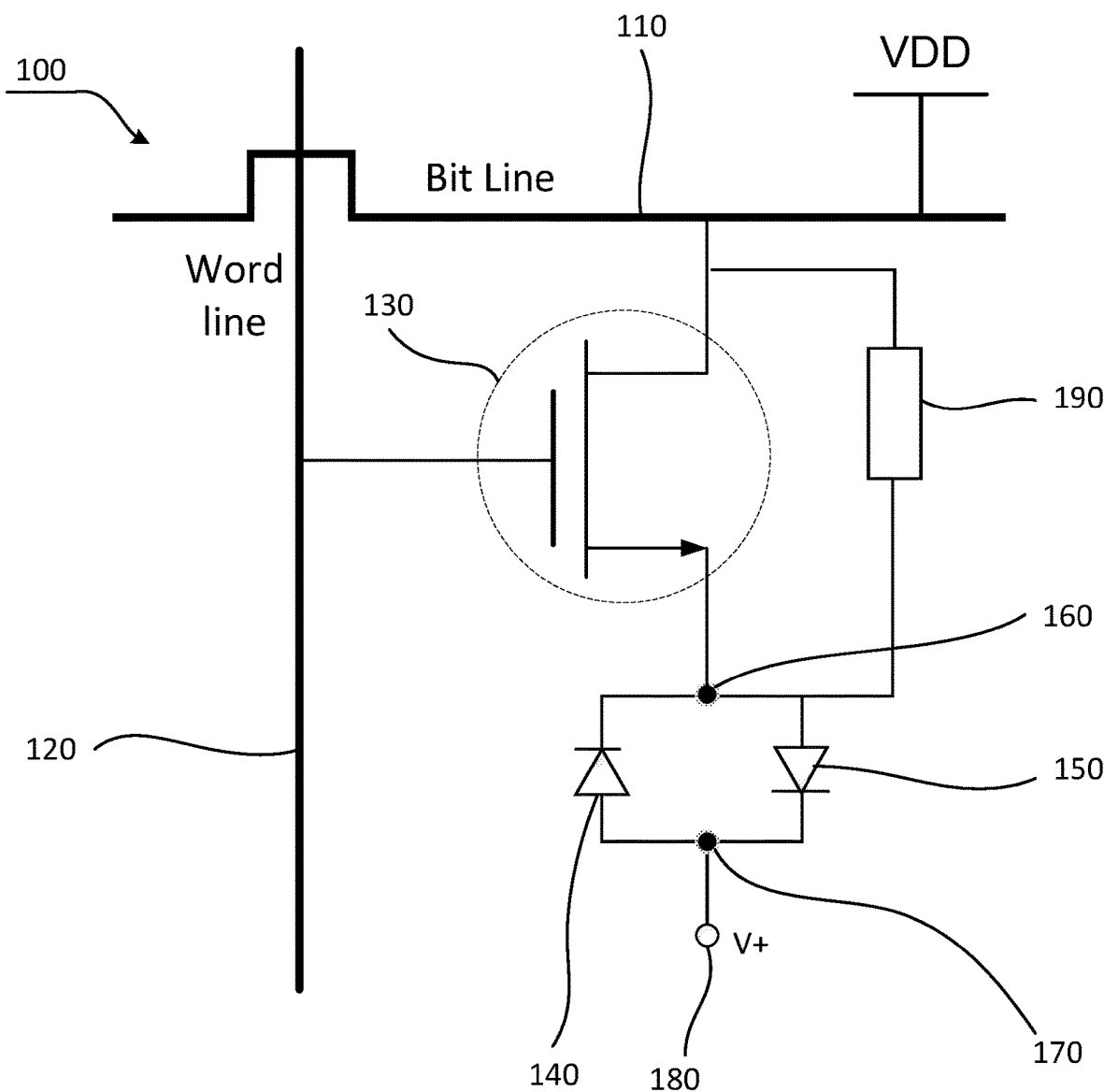
FIG. 1 is a schematic circuit diagram of a DRAM cell according to some embodiments of the present disclosure.

A list of reference numerals in the drawings is provided below.

| | |
|---|---|
| 100 | DRAM cell |
| 110 | bit line |
| 120 | word line |
| 130 | transistor |
| 140 | first diode |
| 150 | second diode |
| 160 | first node |
| 170 | second node |
| 180 | node voltage |
| 190 | current sense amplifier |
| VDD | power supply voltage |

DETAILED DESCRIPTION

Briefly described below are merely certain exemplary embodiments. As will be recognized by those skilled in the art, these embodiments disclosed herein may be modified in various manners without departing from the spirit or scope of the disclosure. Accordingly, the accompanying drawings and description are to be regarded as intrinsically exemplary rather than limiting.

In this disclosure, the directional and spatial terms "central," "longitudinal," "transverse," "lengthwise," "widthwise," "thickness-wise," "upper," "lower," "front," "rear," "left," "right," "vertical," "horizontal," "top," "bottom," "inner," "outer," "clockwise," "counterclockwise," "axial," "radial," "circumferential," etc., are meant to be used with respect to the configurations shown in the figures. They are intended merely to facilitate and simplify the explanation of the disclosure and do not indicate or imply the stated components or elements have to assume, or be constructed or operated in, particular orientations. Therefore, they are not to be construed as limiting the disclosure.

In addition, the terms "first," "second," etc., are used herein only for the purpose of illustration and are not to be construed as indicating or implying relative importance or implicitly indicating the number of the stated features. Therefore, a feature described with "first," "second" or the like can explicitly or implicitly indicate the presence of one or more such features. As used herein, the term "plurality" has the meaning of "two or more", unless the context clearly indicates otherwise.

In this disclosure, unless defined or limited otherwise, the terms "attached," "coupled," "connected," "fixed," "fastened" or any variant thereof, should be construed in a broad sense to encompass any connection established between two or more components, whether fixedly, detachably or integrally; whether mechanically, physically, electrically or communicatively; whether directly or via an intermediate medium; whether through internal communication or through external interaction. For example, that an element is "coupled" to another element should be interpreted as broad as that the elements may be directly connected together or may be connected through one or more intervening elements. For those of ordinary skill in the art, the aforementioned terms can be interpreted based on their context herein.

In this specification, unless defined or limited otherwise, when a first feature is described as being "on" or "under" a second feature, it can be in direct contact with the second feature, or the first feature and second features can be indirectly contacted through other features therebetween. Moreover, when a first feature is described as being "over", "overlying" or "above" a second feature, it may either be situated normally or obliquely over the second feature, or it may only be located at a horizontal level higher than a horizontal level at which the second feature is located. Similarly, when a first feature is described as being "under," "underlying" or "beneath" a second feature, it may either be situated normally or obliquely under the second feature, or it may only be located at a horizontal level lower than a horizontal level at which the second feature is located.

The following disclosure provides many different embodiments or examples for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Further, although the disclosure provides examples of various particular processes and materials, those of ordinary skills in the art will recognize the use of other processes and/or the use of other materials.

Referring to FIG. 1, a schematic circuit diagram illustrates a DRAM cell 100 according to some embodiments of the present disclosure. As shown in FIG. 1, the DRAM cell 100 includes: a transistor 130, which includes a gate electrically coupled to a word line 120 of an address decoder and a drain electrically coupled to a bit line 110 of the address decoder.

In some embodiments, the word line 120 may be coupled to a turn-on voltage. For example, the word line 120 is configured to turn on and off the transistor 130 through the turn-on voltage. The bit line 110 is coupled to a power supply voltage "VDD." The bit line 110 is configured to write and read data.

In some embodiments, the DRAM cell 100 may further include:

a first diode 140; and a second diode 150, where an anode of the second diode 150 is coupled to a cathode of the first diode 140 at a first node 160 and a cathode of the second diode 150 is coupled to an anode of the first diode 140 at a second node 170. In some embodiments, the first node 160 is coupled to a source of the transistor 130. The second node 170 is coupled to a node voltage 180.

In some embodiments, an absolute value of a difference between the node voltage 180 and the power supply voltage VDD is smaller than a forward voltage (also referred to as a "cut-in voltage") of the first diode and the second diode 140, 150. For example, to "turn on" and conduct current in the forward direction, a diode needs a certain amount of positive voltage to be applied across it. The voltage is usually greater than the forward voltage in order for the diode to be on and conduct current in the forward direction. That is, the forward voltage or cut-in voltage may be deemed as the minimum voltage required to turn on the diode. In some embodiments, the cut-in voltage may be 0.7 V for a silicon diode, and 0.3V for a germanium-based diode.

When the turn-on voltage is applied to the word line 120, the transistor 130 will be turned on. The bit line 110 is coupled to the power supply voltage. The difference between the voltage at the bit line 160 and the node voltage 180 is smaller than the cut-in voltage of the first diode and the second diode 140, 150. As a result, a current flowing into the two diodes cannot go through to turn on the diodes, and is thus maintained therein, enabling data stored on the bit line 110 to be kept without a need of refresh or restoration.

In some embodiments, the DRAM cell may further include: a current sense amplifier 190 having a first end connected to the bit line 110 and a second end connected to the first node 160.

In some embodiments, the node voltage 180 may equate a half of the power supply voltage VDD.

In some embodiments, each of the first diode and the second diode 140, 150 may comprise a charge-storage diode.

According to some embodiments, pairs of serially connected diodes are used in DRAM cells 100, dispensing with the need of regular refresh for maintaining the stored data and thus reducing power consumption of the cells 100. In addition, the diodes 140, 150 can store electrical charge at a higher speed than that of the capacitors, thereby improving data transmission capability of DRAM devices.

Figure 2:
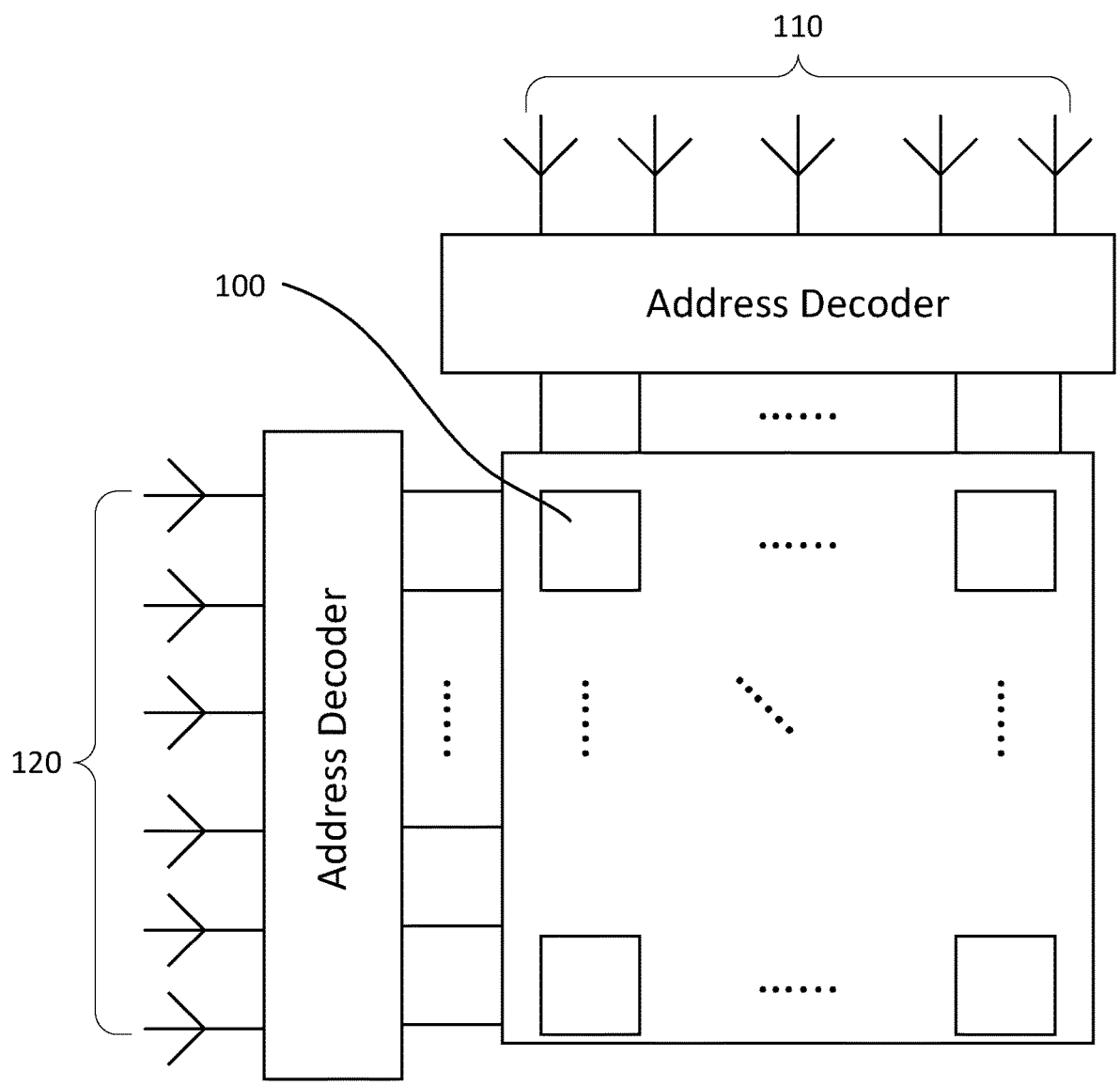
FIG. 2 is a schematic circuit diagram of a DRAM device comprising DRAM cells according to some embodiments of the present disclosure.

FIG. 2 is a schematic circuit diagram of a DRAM device comprising DRAM cells according to some embodiments of the present disclosure. As shown in FIG. 2, a DRAM device may include: an address decoder including a plurality of word lines 120 and a plurality of bit lines 110, where the bit lines 110 and the word lines 120 cross one another to define a memory matrix.

The DRAM device further includes: a plurality of DRAM cells 100, where the DRAM cells 100 are distributed in the memory matrix, and each of the DRAM cells is coupled to at least one of the bit lines 110 and at least one of the word lines 120.

In some embodiments, each of the DRAM cells 100 is the same or similar to the DRAM cell 100 shown in FIG. 1. For example, each of the DRAM cells 100 includes: a transistor 130 having a gate electrically coupled to a corresponding one of the word lines 120 of the address decoder and a drain electrically coupled to a corresponding one of the bit lines 110 of the address decoder. In some embodiments, the plurality of bit lines 110 include write bit lines and read bit lines.

In some embodiments, each of the DRAM cells 100 further includes:

a first diode 140;

a second diode 150, where an anode of the second diode 150 is coupled to a cathode of the first diode 140 through a first connection line, and a cathode of the second diode is coupled to an anode of the first diode 140 through a second connection line;

a first node 160 located on the first connection line that couples the first diode and the second diode 140, 150, the first node 160 coupled to a source of the transistor 130; and a second node 170 located on the second connection line that couples the first diode and the second diode 140, 150, the second node 170 coupled to a node voltage 180.

In some embodiments, the first diode 140 can be disposed interchangeably with the second diode 150. Thus, the above described arrangement of the first and second nodes 160, 170 as shown in FIG. 1 is merely illustrative, and does not limit them in terms of position as long as the pair of diodes 140, 150 is coupled at one end to the source of the transistor 130 and at the other end to the node voltage 180.

The absolute value of the difference between the node voltage 180 and the power supply voltage VDD is smaller than a cut-in voltage of the first diode and the second diode 140, 150. As a result, electrical charge in the first diode and the second diode 140, 150, is stored therein and cannot go through therefrom.

In some embodiments, the DRAM device may further include: a current sense amplifier 190, which has a first end connected to a corresponding one of the bit lines 110 and a second end connected to a corresponding first node 160. Examples of the current sense amplifier 190 may include, but are not limited to, any current sense amplifier. For example, other types of sense amplifier are possible.

In some embodiments, the node voltage 180 may be equal to a half of the power supply voltage VDD, which may typically be set to 1V.

In some embodiments, each of the first diode and the second diode 140, 150 may include, but not limited to, a charge-storage diode.

In the DRAM device according to some embodiments, pairs of serially connected diodes are used in DRAM cells 100, dispensing with the need of regular refresh for maintaining the stored data and thus reducing power consumption of the cells 100. In addition, the diodes 140, 150 can store electrical charges at a higher speed than that of the capacitors, thereby improving data transmission capability of DRAM devices.

In some embodiments, with reference to the DRAM device shown in FIG. 2, a storage method for a DRAM device may include:

providing a DRAM device, the DRAM device comprising an address decoder and a plurality of DRAM cells 100 as described above with reference to FIG. 1, the address decoder comprising a plurality of word lines 120 and a plurality of bit lines 110 intersecting the word lines 120 to define a matrix, the bit lines 110 configured to write and read data, the DRAM cells 100 distributed in the matrix, each of the DRAM cells 100 coupled to at least one of the bit lines 110 and at least one of the word lines 120; and storing data in the first diode and the second diode 140, 150.

In some embodiments, the storage method for a DRAM device may further include:

applying a turn-on voltage to the word line 120 to turn on the transistor 130 and then applying the power supply voltage VDD to the bit line 110 so as to write a datum; and applying the power supply voltage to the bit line 110 and then applying the turn-on voltage to the word line 120 to turn on the transistor 130 so as to read a datum.

In some embodiments, writing a datum may include the following scenarios.

In case of the datum to be written being "1", writing the datum may include:

applying the turn-on voltage to the word line 120 to turn on the transistor 130;

applying the power supply voltage VDD represented as "1" to the bit line 110, so that the voltage at the first node 160 is equal to the power supply voltage VDD "1";

applying the node voltage 180 to the second node 170, where the node voltage 180 is lower than the power supply voltage VDD "1"; and after the power supply voltage VDD "1" is introduced into the first diode and the second diode 140, 150 via the transistor 130 and stored therein, removing the turn-on voltage to turn off the transistor 130.

In case of the datum to be written being "0", writing the datum may include:

applying the turn-on voltage to the word line 120 to turn on the transistor 130;

applying to the bit line 110 the power supply voltage VDD that is reduced to be "0", so that the voltage at the first node 160 is equal to the power supply voltage VDD represented as "0";

applying the node voltage 180 that is lower than the power supply voltage VDD "1" to the second node 170; and after the power supply voltage VDD "0" is introduced into the first diode and the second diode 140, 150 via the transistor 130 and stored therein, removing the turn-on voltage so that the transistor 130 is turned off.

In some embodiments, reading a datum may include the following scenarios.

In case of the datum to be read being "1", reading the datum may include:

applying the power supply voltage VDD represented as "1" to the bit line 110;

applying the turn-on voltage to the word line 120 to turn on the transistor 130;

sensing the absence of a current between the bit line 110 and the first node 160; and reading the datum "1" stored on the first diode and the second diode 140, 150.

In case of the datum to be read being "0", reading the datum may include:

applying the power supply voltage VDD represented as "1" to the bit line 110;

applying the turn-on voltage to the word line 120 to turn on the transistor 130;

sensing a current between the bit line 110 and the first node 160; and reading the datum "0" stored on the first diode and the second diode 140, 150.

The absolute value of the difference between the node voltage 180 applied to the second node 170 and the power supply voltage VDD may be smaller than a cut-in voltage of the first diode and the second diode 140, 150.

The first diode and the second diode 140, 150 are configured to store information represented by the amount of electrical charge stored thereon. That is, datum "0" represents the absence of electrical charge and datum "1" represents presence of electrical charge. In some embodiments, the power supply voltage VDD is not fixed, but is represented as the voltage of a current state in the reading or writing process. For example, the power supply voltage VDD represented as "1" indicates a high voltage level, while power supply voltage VDD "0" indicates a low voltage level.

In some embodiments, the current between the bit line 110 and the first node 160 may be sensed, amplified and read by a current sense amplifier 190.

In some embodiments, the node voltage 180 applied to the second node 170 may be equal to a half of the power supply voltage VDD.

In some embodiments of the present disclosure, pairs of serially connected diodes are used in the DRAM device as DRAM cells 100, dispensing with the need of regular refresh for maintaining the stored data and thus reducing power consumption of the cells 100. Moreover, data reading is implemented through a current sense amplifier 190 that senses and detects the current between the bit line 110 and the first node 160, thereby improving data transmission performance of the DRAM device.

With reference to embodiments of the DRAM device, another exemplary storage method for a DRAM device includes:

providing a DRAM device, the DRAM device comprising an address decoder and a plurality of DRAM cells 100 as described above with reference to FIG. 1, the address decoder comprising a plurality of word lines 120 and a plurality of bit lines 110 intersecting the word lines 120 to define a matrix, the bit lines 110 configured to write and read data, the DRAM cells 100 distributed in the matrix, each of the DRAM cells 100 coupled to at least one of the bit lines 110 and at least one of the word lines 120; and storing data in the first diode and the second diode 140, 150.

In some embodiments, the storage method for a DRAM device may include steps for writing and reading data.

In case of the datum to be written being "1", writing the datum may include:

applying a turn-on voltage to the word line 120 to turn on the transistor 130, where the turn-on voltage is equal to the sum of a power supply voltage VDD and a threshold voltage of the transistor 130, i.e., Turn-On Voltage ($V_{tn}$)=Power Supply Voltage (VDD)+Threshold Voltage ($V_{th}$);

applying the power supply voltage VDD of 1V to the write bit line 110 so that a voltage at a first node 160 is equal to the power supply voltage VDD, i.e., 1V; and applying to the second node 170 a node voltage 180, which is one half of the power supply voltage VDD, i.e., 0.5V.

Therefore, the absolute value of the difference between the node voltage 180 and the voltage at the first node 160, i.e., the power supply voltage VDD, is 0.5V. Assuming that the first and second diode 140, 150 are silicon diodes with a cut-in voltage of 0.7 V, the absolute value of the difference between the node voltage 180 and the power supply voltage VDD will be smaller than the cut-in voltage of these silicon diodes 140, 150, and thus they will not be turned on. As a result, the datum "1" to be written by the write bit line is introduced into the first diode and the second diode 140, 150 via the transistor 130 and stored therein. By subsequently removing the turn-on voltage from the transistor 130, the transistor 130 can be turned off, and thus the datum "1" continues to be stored in the diodes 140, 150.

In case of the datum to be written being "0", writing the datum may include:

applying the turn-on voltage to the word line 120 to turn on the transistor 130, where the turn-on voltage is equal to the sum of the power supply voltage VDD and the threshold voltage of the transistor 130, i.e., Turn-On Voltage ($V_{tn}$) =Power Supply Voltage (VDD)+Threshold Voltage ($V_{th}$);

applying to the write bit line 110 the power supply voltage VDD that is reduced to 0V, so that the voltage at the first node 160 is equal to the power supply voltage VDD, i.e., 0V; and applying to the second node 170 the node voltage 180, which is one half of the power supply voltage VDD of 1V, i.e., 0.5V. Assuming that the first and second diode 140, 150 are silicon diodes with a cut-in voltage of 0.7V, the first and second diode 140, 150 cannot be turned on because the node voltage 180 of 0.5V is smaller than the cut-in voltage of 0.7V. Moreover, due to the reverse voltage drop from the power supply voltage VDD to the node voltage 180 on the write bit line (i.e., the node voltage 180 is higher than the power supply voltage VDD on the write bit line), the voltage on the write bit line cannot be imported to the node voltage 180, and thus the write bit line can write the datum "0".

As a result, the datum "0" to be written by the write bit line is introduced into the first diode and the second diode 140, 150 via the transistor 130 and stored therein. Subsequently, the turn-on voltage is removed to turn off the transistor 130.

In some embodiments, in case of the datum to be read being "1", reading the datum may include:

applying the power supply voltage of 1V to the read bit line 110, ensuring that the voltage on the read bit line is not lower than the voltage at the first node 160;

applying the turn-on voltage to the word line 120 to turn on the transistor 130, where the turn-on voltage is equal to the sum of the power supply voltage VDD of 1V and the threshold voltage of the transistor 130, i.e., Turn-On Voltage ($V_{tn}$)=Power Supply Voltage (VDD)+Threshold Voltage ($V_{th}$);

sensing absence of a current between the bit line 110 and the first node 160 by a current sense amplifier 190, which indicates that the power supply voltage VDD of 1V on the bit line 110 is equal to the voltage at the first node 160. That is, there is a voltage of 1V present in the first diode and the second diode 140, 150, and thus the datum "1" is stored in the first diode and the second diode 140, 150; and reading the datum "1" stored in the first diode and the second diode 140, 150 by the read bit line.

In case of the datum to be read being "0", reading the datum may include:

applying the power supply voltage of 1V to the read bit line 110, ensuring that the voltage on the read bit line is not lower than the voltage at the first node 160;

applying the turn-on voltage to the word line 120 to turn on the transistor 130, where the turn-on voltage is equal to the sum of the power supply voltage VDD of 1V and the threshold voltage of the transistor 130, i.e., Turn-On Voltage ($V_{tn}$)=Power Supply Voltage (VDD)+Threshold Voltage ($V_{th}$);

using the current sense amplifier 190 to sense presence of a current between the bit line 110 and the first node 160, and to amplify the current, where the current present between the bit line 110 and the first node 160 indicates that the power supply voltage VDD on the bit line 110 is higher than the voltage at the first node 160, and that the voltage at the first node 160 is lower than 1V. That is, there is no voltage across the first diode and the second diode 140, 150, and thus the datum "0" is stored in the first diode and the second diode 140, 150, as can be known from the above described writing processes; and reading the datum "0" stored in the first diode and the second diode 140, 150 by the read bit line.

The absolute value of the difference between the node voltage 180 applied to the second node 170 and the power supply voltage VDD is smaller than the cut-in voltage of the first diode and the second diode 140, 150.

The first diode and the second diode 140, 150 are configured to store information represented by the amount of electrical charge stored therein. That is, data "0" represents the absence of electrical charge and data "1" represents the presence of electrical charge.

In some embodiments, the current between the bit line 110 and the first node 160 may be sensed by the current sense amplifier 190.

In some embodiments, the node voltage 180 applied to the second node 170 may be equal to a half of the power supply voltage VDD. For example, the node voltage is 0.5V when the power supply voltage VDD is 1V.

In some embodiments of the present disclosure, pairs of serially connected diodes are used in DRAM cells 100 of the DRAM device, dispensing with the need of regular refresh for maintaining the stored data and thus reducing power consumption of the DRAM device. Moreover, data reading is implemented through a current sense amplifier 190 that senses and detects the current between the bit line 110 and the first node 160, thereby improving data transmission performance of the DRAM device.

Described above are merely embodiments of the present disclosure and do not limit the scope thereof in any sense. All changes and substitutions easily devisable by those of ordinary skills in the art in light of the teachings disclosed herein fall within the scope of the present disclosure defined by the appended claims.

What is claimed is:

1. A dynamic random-access memory (DRAM) cell, comprising:
a transistor having a gate electrically coupled to a word line of an address decoder and a drain electrically coupled to a bit line of the address decoder, wherein the bit line is coupled to a power supply voltage;
a first diode; and
a second diode, wherein an anode of the second diode is coupled to a cathode of the first diode at a first node, and a cathode of the second diode is coupled to an anode of the first diode at a second node, the first node is coupled to a source of the transistor, the second node is coupled to a node voltage, wherein an absolute value of a difference between the node voltage and the power supply voltage is smaller than a cut-in voltage of the first diode and the second diode.

2. The DRAM cell of claim 1, further comprising:
a current sense amplifier having a first end coupled to the bit line and a second end coupled to the first node, wherein the current sense amplifier is configured to sense a current between the bit line and the first node, and to amplify and read the current.

3. The DRAM cell of claim 1, wherein the node voltage equals to a half of the power supply voltage.

4. The DRAM cell of claim 1, wherein each of the first diode and the second diode comprise a charge-storage diode.

5. A dynamic random-access memory (DRAM) device, comprising:
an address decoder, comprising a plurality of word lines and a plurality of bit lines intersecting each other to define a matrix, each of the bit lines configured to write and read data; and
a plurality of DRAM cells distributed in the matrix, each of the DRAM cells coupled to at least one of the bit lines and at least one of the word lines,
wherein the each of the DRAM cells comprises:
a transistor having a gate electrically coupled to a word line of an address decoder and a drain electrically coupled to a bit line of the address decoder, wherein the bit line is coupled to a power supply voltage;
a first diode; and
a second diode, wherein an anode of the second diode is coupled to a cathode of the first diode at a first node, and a cathode of the second diode is coupled to an anode of the first diode at a second node, the first node is coupled to a source of the transistor, the second node is coupled to a node voltage,
wherein an absolute value of a difference between the node voltage and the power supply voltage is smaller than a cut-in voltage of the first diode and the second diode.

6. The DRAM device of claim 5, wherein the each of the DRAM cell further comprises a current sense amplifier having a first end coupled to the bit line and a second end coupled to the first node, wherein the current sense amplifier is configured to sense a current between the bit line and the first node, and to amplify and read the current.

7. The DRAM device of claim 5, wherein the node voltage equals to a half of the power supply voltage.

8. The DRAM device of claim 5, wherein each of the first and second diodes comprises a charge-storage diode.

9. A storage method for a dynamic random-access memory (DRAM) device, comprising:
providing a DRAM device comprising an address decoder and a plurality of DRAM cells, the address decoder comprising a plurality of word lines and a plurality of bit lines intersecting each other to define a matrix, each of the bit lines configured to write and read data, the DRAM cells distributed in the matrix, each of the DRAM cells coupled to at least one of the bit lines and at least one of the word lines; and
storing data on a first diode and a second diode, wherein the each of the DRAM cells comprises:
a transistor having a gate electrically coupled to a word line of an address decoder and a drain electrically coupled to a bit line of the address decoder, wherein the bit line is coupled to a power supply voltage;
a first diode; and
a second diode, wherein an anode of the second diode is coupled to a cathode of the first diode at a first node, and a cathode of the second diode is coupled to an anode of the first diode at a second node, the first node is coupled to a source of the transistor, the second node is coupled to a node voltage,
wherein an absolute value of a difference between the node voltage and the power supply voltage is smaller than a cut-in voltage of the first diode and the second diode.

10. The method of claim 9, wherein the each of the DRAM cell further comprises a current sense amplifier having a first end coupled to the bit line and a second end coupled to the first node, wherein the current sense amplifier is configured to sense a current between the bit line and the first node, and to amplify and read the current.

11. The method of claim 9, wherein each of the first diode and the second diode comprises a charge-storage diode.

12. The method of claim 9, further comprising:
applying a turn-on voltage to the word line to turn on the transistor and then applying the power supply voltage to the bit line so as to write a datum.

13. The method of claim 12, further comprising:
applying the node voltage to the second node, wherein the node voltage is lower than the power supply voltage; and
after the power supply voltage is introduced into the first diode and the second diode via the transistor and stored therein, removing the turn-on voltage to turn off the transistor.

14. The method of claim 12, wherein the turn-on voltage is the sum of the power supply voltage and a threshold voltage of the transistor.

15. The method of claim 12, further comprising:
applying the power supply voltage to the bit line and then applying the turn-on voltage to the word line to turn on the transistor so as to read a datum.

16. The method of claim 13, further comprising:
sensing an absence or a presence of a current between the bit line and the first node; and
reading the datum stored in the first diode and the second diode based on the absence or presence of the current.

17. The method of claim 16, wherein a datum of "1" represents the presence of the current between the bit line and the first node.

18. The method of claim 16, wherein a datum of "0" represents the absence of the current between the bit line and the first node.

19. The method of claim 9, wherein the power supply voltage includes a high voltage level and a low voltage level.

20. The method of claim 9, wherein the node voltage applied on the second node equals to a half of the power supply voltage.

* * * * *